(12) United States Patent
Maeda et al.

(10) Patent No.: US 7,329,317 B2
(45) Date of Patent: Feb. 12, 2008

(54) METHOD FOR PRODUCING SILICON WAFER

(75) Inventors: Susumu Maeda, Hiratsuka (JP); Hiroshi Inagaki, Hiratsuka (JP); Shigeki Kawashima, Hiratsuka (JP); Shoei Kurosaka, Hiratsuka (JP); Kozo Nakamura, Hiratsuka (JP)

(73) Assignee: Komatsu Denshi Kinzoku Kabushiki Kaisha, Kangawa (JP)

( * ) Notice: Subject to any disclaimer, the term of this patent is extended or adjusted under 35 U.S.C. 154(b) by 231 days.

(21) Appl. No.: 10/533,147

(22) PCT Filed: Oct. 31, 2003

(86) PCT No.: PCT/JP03/14001

§ 371 (c)(1),
(2), (4) Date: Apr. 27, 2005

(87) PCT Pub. No.: WO01/88230

PCT Pub. Date: Nov. 22, 2001

(65) Prior Publication Data

US 2006/0005762 A1    Jan. 12, 2006

(30) Foreign Application Priority Data

Oct. 31, 2002    (JP) .............................. 2002-317955

(51) Int. Cl.
 C30B 15/00    (2006.01)
 C30B 21/06    (2006.01)
 C30B 23/00    (2006.01)
 C30B 30/04    (2006.01)
 C30B 27/02    (2006.01)

(52) U.S. Cl. .............................. 117/20; 117/13; 117/14; 117/15; 117/19; 117/21; 117/30; 117/32; 117/94; 117/935

(58) Field of Classification Search .................. 117/13, 117/20, 30, 32, 19, 14, 15, 21, 94, 935
See application file for complete search history.

(56) References Cited

U.S. PATENT DOCUMENTS 5,904,769 A * 5/1999 Ohashi et al. ................. 117/89

(Continued)

FOREIGN PATENT DOCUMENTS

JP    2000128690    5/2000

(Continued)

OTHER PUBLICATIONS

T Sato, "Effect of LAD on Epitaxial wafer", *Silicon Technology*, No. 16, Apr. 24, 2000, 16th Meeting of Silicon Technology Division, The Japan Society of Applied Physics [partial translation].

(Continued)

*Primary Examiner*—Yogendra N. Gupta
*Assistant Examiner*—Seyed Masoud Malekzadeh
(74) *Attorney, Agent, or Firm*—Welsh & Katz, Ltd.

(57) ABSTRACT

The present invention is to produce a silicon crystal wherein the boron concentration in the silicon crystal and the growth condition V/G are controlled so that the boron concentration in the silicon crystal is no less than $1\times10^{18}$ atoms/cm$^3$ and the growth condition V/G falls within the epitaxial defect-free region $\alpha_2$ whose lower limit line LN1 is the line indicating that the growth rate V gradually drops as the boron concentration increases. A silicon wafer is also produced wherein the boron concentration in the silicon crystal and the growth condition V/G are controlled so as to include at least the epitaxial defect region $\beta_1$, and both the heat treatment condition and the oxygen concentration of the silicon crystal are controlled so that no OSF nuclei grow to OSFs.

7 Claims, 6 Drawing Sheets

U.S. PATENT DOCUMENTS 6,548,035 B1 * 4/2003 Kimura et al. ............ 423/328.2
6,565,822 B1 * 5/2003 Hoshi et al. .............. 423/328.2

FOREIGN PATENT DOCUMENTS

| JP | 2000219598 | 8/2000 |
| JP | 2001-039797 | 2/2001 |
| JP | 2001039797 | 2/2001 |
| JP | 2001261495 | 9/2001 |
| JP | 2003002786 | 1/2003 |
| WO | WO 00/46433 | 8/2000 |
| WO | WO 01/71069 | 9/2001 |
| WO | WO 01/88230 | 11/2001 |
| WO | WO 03/000962 | 1/2003 |

OTHER PUBLICATIONS

Asayama, et al., "Point Defect Behavior in Heavily Boron Doped Silicon Single Crystals", *Extended BSTRACTS (The 60th Autumn Meeting, 1999)*, The Japan Society of Applied Physics, No. 0, "3p-ZY-4". [partial translation].

Dornberger, et al. "Influence of boron concentration on the oxidation-induced stacking fault ring in Czochralski silicon crystals", *Journal of Crystal Growth*, 180 (1997) pp. 343-352.

* cited by examiner

CRYSTAL PULL CONDITIONS AND INTERFACIAL SHAPE

FIG.6

METHOD FOR PRODUCING SILICON WAFER

TECHNICAL FIELD

The present invention relates to a method for producing silicon wafers, and more particularly to a method which, during the production of a silicon wafer on which an epitaxial growth layer is formed, can make the epitaxial layer free of defects.

BACKGROUND ART

Silicon crystals are produced by being pulled and grown using the Czochralski (CZ) method. The grown silicon crystal ingot is then sliced into silicon wafers. Semiconductor devices are fabricated by operations in which device layers are formed on the surface of the silicon wafer.

However, in the course of silicon crystal growth, crystal defects known as "grown-in defects" arise.

With the progress in recent years toward higher density and smaller geometries in semiconductor circuits, the presence of such grown-in defects near the surface layer of the silicon wafer where devices are fabricated can no longer be tolerated. This situation has led to explorations on the possibility of manufacturing defect-free crystals. The following three types of crystal defects are detrimental to device characteristics:

a) Crystal originated particles (COP) are void defects which arise from the coalescing of vacancies;
b) Oxidation-induced stacking faults (OSF); and
c) Dislocation loop clusters that arise from the aggregation of interstitial silicon (also known as interstitial silicon dislocation defects, or I-defects).

A defect-free silicon monocrystal is recognized or defined as a crystal which is free or substantially free of the three above types of defects.

One method for obtaining silicon wafers that are free of grown-in defects near the surface layer where device circuits are created is to use epitaxial growth to grow a defect-free layer on the wafer surface.

That is, an epitaxial silicon wafer is a high value-added silicon wafer carefully created by the vapor-phase growth of an epitaxial growth layer (also known as an "epilayer") having a high degree of crystal perfection on a silicon wafer substrate. Because the epitaxial growth layer has a high degree of crystal perfection, it is thought to be a substantially defect-free layer. Hence, device fabrication on an epitaxial growth layer dramatically enhances the device characteristics compared with device fabrication on the surface layer of a silicon wafer substrate. Because the degree of crystal perfection in the epitaxial growth layer was not thought to be strongly affected by the crystal qualities of the underlying silicon wafer substrate, little importance has been placed until now on the quality of the silicon wafer substrate itself.

Prior-Art 1

However, in recent years, as the systems used to inspect defects have become increasingly sensitive and the criteria for evaluating defects have become more exacting, it has been found that defects within the silicon wafer substrate propagate to the epitaxial growth layer, where they appear as defects in the epitaxial growth layer (referred to herein as "epitaxial defects"). This is described in Non-Patent Reference 1 (Sato: 16$^{th}$ Meeting of Silicon Technology Division, Japan Society of Applied Physics; Apr. 24, 2000; p. 35).

Device manufacturers have thus begun calling for the production of epitaxial defect-free epitaxial silicon wafers having an epitaxial growth layer that is free of defects by forming an epitaxial growth layer on a silicon wafer substrate which is free of crystal defects that cause epitaxial defects.

Grown-in defects in a silicon wafer substrate include defects which readily propagate to the epitaxial growth layer and defects which do not readily propagate. OSFs and dislocation loop clusters in particular are very likely to propagate to the epitaxial growth layer and become epitaxial defects, and so must be excluded from the silicon wafer substrate.

If the temperature gradient G in the crystal axis (vertical) direction is assumed to be constant, the defects in a silicon monocrystal vary with the pull rate V of the silicon monocrystal. In other words, it is known that, as the pull rate V decreases from a high speed, void defects (COPs), OSFs (ring-like OSFs, abbreviated as "Ring-OSF," which are stacking faults observed on a ring concentric with the center of the wafer following heat treatment in an oxidizing atmosphere), defect-free regions and dislocation loop clusters arise one after another.

In P-type silicon crystals, boron (B) is added to the silicon crystal as a dopant. In p/p$^+$ and p/p$^{++}$ epitaxial silicon wafers containing a high concentration of boron, about $1\times10^{18}$ atoms/cm$^3$ to $1\times10^{19}$ atoms/cm$^3$ of boron have been added to the silicon crystal.

Prior-Art 2

Non-Patent Reference 2 (E. Dornberger, E. Graff, D. Suhren, M. Lambert, U. Wagner and W. von Ammon: *Journal of Crystal Growth*, 180 (1997), 343) describes the influence of boron on the behavior of crystal defects. This Non-Patent Reference 2 discloses that adding boron to a high concentration in a silicon crystal results in the generation of R-OSFs at a higher pull rate V.

Conditions currently used for the production of p$^+$ and p$^{++}$ silicon crystals are described here with referring to attached diagrams according to the present invention.

Figure 2A:
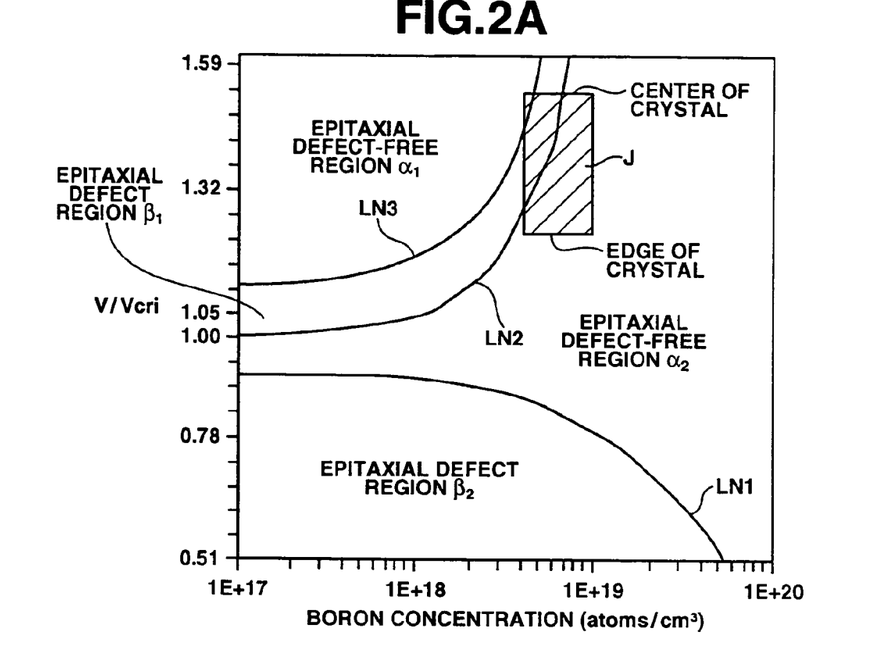
FIGS. 2A and 2B are diagrams which correspond to FIG. 1 and show the relationship with target production conditions regions.

FIG. 2A shows the distribution of epitaxial defect regions and epitaxial defect-free regions. The vertical axis represents the normalized pull rate V/Vcri when the temperature gradient G in the crystal axis (vertical) direction is assumed to be constant, and the horizontal axis represents the concentration of boron added to the silicon crystal in atoms/cm$^3$. The normalized pull rate V/Vcri refers herein to the pull rate normalized by the critical rate Vcri when the added boron concentration is $1\times10^{17}$ atoms/cm$^3$, and the critical rate Vcri refers to the pull rate at which R-OSFs at the center of the silicon crystal disappear when the pull rate V is gradually decreased.

Epitaxial defect-free region α1 in FIG. 2A is an epitaxial defect-free region where void defects appear in the silicon wafer substrate and the epitaxial growth layer is free of defects. Epitaxial defect region β1 is an epitaxial defect region where OSFs appear in the silicon wafer substrate and defects appear in the epitaxial growth layer. Epitaxial defect-free region α2 is an epitaxial defect-free region where the silicon wafer substrate is free of defects and the epitaxial growth layer is free of defects. Epitaxial defect region β2 is an epitaxial defect region where dislocation loop clusters appear in the silicon wafer substrate and defects appear in the epitaxial growth layer.

Up until now, p$^+$ silicon crystals have been produced in the region indicated as J (called the production conditions region) in FIG. 2A. The production conditions region J includes epitaxial defect region β1. In order to suppress epitaxial defects, attempts have been made to produce silicon crystals within epitaxial defect-free region α2 by moving the production conditions region to a lower V side—that is, to the production conditions region K shown in FIG. 2B.

Prior-Art 3

Here, in low boron concentration p⁻ silicon crystals (having a boron concentration of less than $1 \times 10^{18}$ atoms/cm³), when the pull rate V is lowered, defects arise in the epitaxial growth layer due to dislocation loop clusters. However, in high boron concentration p⁺ and p⁺⁺ silicon crystals, Non-Patent Reference 3 (Asayama, et al.: 1999 Fall Meeting of Japan Society of Applied Physics; 3p-ZY-4) reports the suppression of dislocation loop clusters even at the same low pull rate V.

Accordingly, it was previously thought that, in the production of high-boron concentration p⁺ and p⁺⁺ silicon crystals, lowering the pull rate V would enable the relatively easy production of high-quality silicon crystals without epitaxial defects. That is, it was predicted that a lower limit for the epitaxial defect-free region α2 exists at low boron concentrations (less than $1 \times 10^{18}$ atoms/cm³), but does not exist at high boron concentrations ($1 \times 10^{18}$ atoms/cm³ to $1 \times 10^{19}$ atoms/cm³).

DISCLOSURE OF THE INVENTION

Contrary to the above prediction, we have found that when the pull rate V is lowered, dislocation loop clusters which can cause epitaxial defects arise even in high boron concentration p⁺ and p⁺⁺ silicon crystals.

With the foregoing in view, a first object of the present invention is to determine the lower limit LN1 of epitaxial defect-free region α2 and thereby make it possible to manufacture in a good yield high-quality epitaxial silicon wafers which are free of epitaxial defects.

With regard to epitaxial defect region β1, because OSFs which occur in the silicon wafer substrate propagate to the epitaxial growth layer where they appear as defects, the conventional thinking up until now held that silicon crystals should be produced in a production conditions region which does not include this region.

However, we have discovered that, even when a silicon crystal has been produced in a production conditions region that includes epitaxial defect region β1, depending on the process conditions, no defects appear in the epitaxial growth layer.

In light of these circumstances, a second object of the invention is to enable high-quality epitaxial silicon wafers which are free of epitaxial defects to be produced in a good yield within a production conditions region that includes epitaxial defect region β1.

Also, epitaxial defect-free region α1 has been thought of as a region where void defects arise in the silicon wafer substrate, but defects do not appear in the epitaxial growth layer.

However, device manufacturers lately have been calling for the formation of epitaxial growth layers as thin films having a thickness of no more than 2 μm. We have found that defects caused by void defects which were thought not to appear in epitaxial growth layers having an ordinary film thickness (about 5 μm) do appear as epitaxial defects in the epitaxial growth layer when it is formed as such a thin film.

In light of the foregoing, a third object of the invention is to make it possible to produce in a good yield high-quality, epitaxial defect-free epitaxial silicon wafers within epitaxial defect-free region α1, even when the epitaxial growth layer is formed as a thin film.

A first aspect of the invention is characterized by a method for producing a silicon wafer which comprises:

a silicon crystal production step of producing a silicon crystal while controlling a concentration of boron in the silicon crystal and a growth condition V/G (where V is a growth rate, and G is a temperature gradient in a crystal axis direction) so as to fall within an epitaxial defect-free region (α2) which is a defect-free region where a silicon wafer substrate is free of defects and an epitaxial growth layer is free of defects and which has a lower limit line (LN1) where, at the boron concentration in the silicon crystal of $1 \times 10^{18}$ atoms/cm³ and above, the growth rate V gradually decreases as the boron concentration rises;

a silicon wafer substrate obtaining step of obtaining the silicon wafer substrate from the silicon crystal; and an epitaxial growth step of forming the epitaxial growth layer on the silicon wafer substrate.

A second aspect of the invention is characterized in, in the silicon crystal production step of the silicon wafer production method according to the first aspect of the invention, making the temperature gradient G in the silicon crystal axis direction uniform to within a given degree between a center of the crystal and an edge of the crystal.

A third aspect of the invention is characterized in, in the silicon crystal production step of the silicon wafer production method according to the second aspect of the invention, applying a magnetic field to the silicon melt from which the silicon crystal is pulled, thereby making the temperature gradient G in the silicon crystal axis direction uniform to within a given degree between the center of the crystal and the edge of the crystal.

A fourth aspect of the invention is characterized in, in the silicon crystal production step of the silicon wafer production method according to the second aspect of the invention, bringing the silicon melt from which the silicon crystal is pulled to a magnetic field-free state and controlling the number of rotations of the silicon crystal, thereby making the temperature gradient G in the silicon crystal axis direction uniform to within a given degree between the center of the crystal and the edge of the crystal.

A fifth aspect of the invention is characterized in, in the silicon crystal production step of the silicon wafer production method according to the second aspect of the invention, bringing the silicon melt from which the silicon crystal is pulled to a magnetic field-free state and controlling the number of rotations of a quartz crucible holding the silicon melt, thereby making the temperature gradient G in the silicon crystal axis direction uniform to within a given degree between the center of the crystal and the edge of the crystal.

A sixth aspect of the invention is characterized in, in the silicon crystal production step of the silicon wafer production method according to the first aspect of the invention, controlling the oxygen concentration in the silicon crystal to no more than $12.5 \times 10^{17}$ atoms/cm³.

A seventh aspect of the invention is characterized in, in the silicon crystal production step of the silicon wafer production method according to the second aspect of the invention, controlling the oxygen concentration in the silicon crystal to no more than $12.5 \times 10^{17}$ atoms/cm³.

Figure 1:
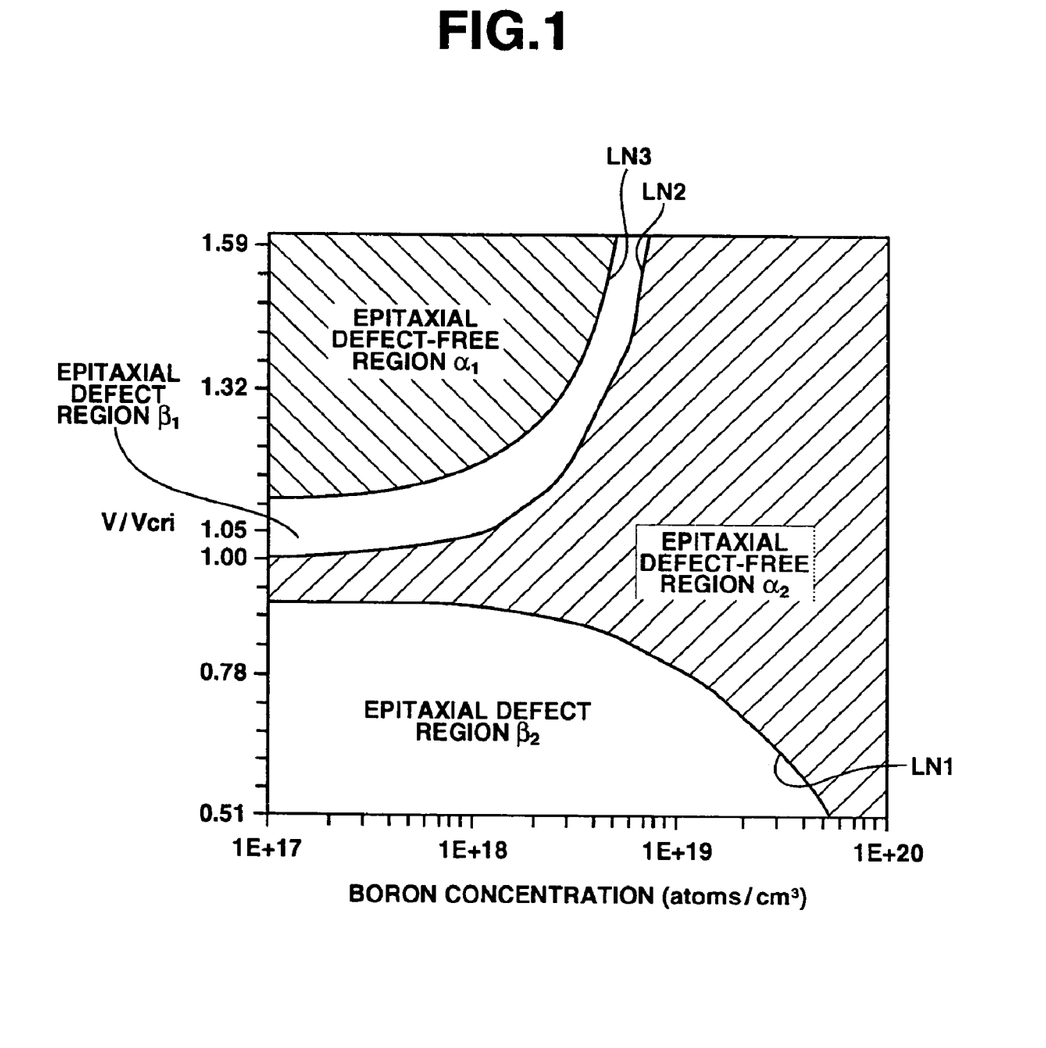
FIG. 1 is a diagram showing the relationship, according to one embodiment of the invention, between the boron concentration (atoms/cm$^3$) in a silicon crystal 10, the growth condition V/Vcri (growth condition V/G), epitaxial defect regions, and epitaxial defect-free regions.

According to the first aspect of the invention, a silicon crystal is produced by, as indicated by LN1 in FIG. 1, controlling the concentration of boron in the silicon crystal and the growth condition V/G (where V is the growth rate, and G is the temperature gradient in the crystal axis direction) so as to fall within an epitaxial defect-free region ($\alpha 2$) which is a defect-free region where a silicon wafer substrate is free of defects and an epitaxial growth layer is free of defects and which has a lower limit line (LN1) where, at boron concentrations in the silicon crystal of $1 \times 10^{18}$ atoms/cm³ and above, the growth rate V gradually decreases as the boron concentration rises.

Next, a silicon wafer substrate is obtained from the silicon crystal that has been produced.

Next, an epitaxial growth layer is formed on the silicon wafer substrate.

In this way, there is produced a high-quality epitaxial silicon wafer wherein defects appear neither in the silicon wafer substrate nor in the epitaxial growth layer.

Because this first aspect of the invention clearly indicates the lower limit LN1 of the epitaxial defect-free region $\alpha 2$, boron concentrations and growth conditions V/G which do not fall below the lower limit LN1 can be precisely determined. By producing a silicon crystal at a boron concentration and a growth condition V/G that do not fall below the lower limit LN1, high-quality epitaxial silicon wafers which are free of epitaxial defects can be manufactured in a high yield.

The second aspect of the invention adds a technical limitation to the silicon crystal production step in the first aspect of the invention. Namely, in the silicon crystal production step, the temperature gradient G in the silicon crystal axis direction is made uniform to within a given degree between a center of the crystal and an edge of the crystal.

As shown in FIG. 3, the uniformity of the temperature gradient G in the silicon crystal axis direction determines the vertical extent of the production conditions region (the extent in the direction of the vertical axis V/Vcri) for the silicon crystal. The more uniform the temperature gradient G in the silicon crystal axis direction between the center $10c$ of the silicon crystal and the edge $10e$ of the crystal, the smaller the vertical extents Be to Bc and Ac to Ae of the production conditions region in FIG. 3 can be made, allowing the production conditions region to more easily fit within epitaxial defect-free region $\alpha 2$ and enabling the production of high-quality epitaxial silicon wafers free of epitaxial defects in a higher yield.

The third aspect of the invention adds another technical limitation to the silicon crystal production step in the second aspect of the invention. Namely, in the silicon crystal production step, a magnetic field is applied to the silicon melt from which the silicon crystal is pulled so as to make the temperature gradient G in the silicon crystal axis direction uniform to within a given degree between the center of the crystal and the edge of the crystal.

The fourth aspect of the invention adds yet another technical limitation to the silicon crystal production step in the second aspect of the invention. In the silicon crystal production step, the silicon melt from which the silicon crystal is pulled is placed in a non-magnetic field state and the rate of rotation of the silicon crystal is controlled so as to make the temperature gradient G in the silicon crystal axis direction uniform to within a given degree between the center of the crystal and the edge of the crystal.

The fifth aspect of the invention adds a yet further technical limitation to the silicon crystal production step in the second aspect of the invention. Namely, in the silicon crystal production step, the silicon melt from which the silicon crystal is pulled is placed in a non-magentic field state and the number of rotations of a quartz crucible holding the silicon melt is controlled so as to make the temperature gradient G in the silicon crystal axis direction uniform to within a given degree between the center of the crystal and the edge of the crystal.

The sixth and seventh aspects of the invention add a still further technical limitation to the silicon crystal production step in, respectively, the first aspect and second aspect of the invention. Namely, in the silicon crystal production step, the oxygen concentration in the silicon crystal is controlled to no more than $12.5 \times 10^{17}$ atoms/cm³.

By controlling the oxygen concentration in the silicon crystal to a low level of no more than $12.5 \times 10^{17}$ atoms/cm³ according to the sixth and seventh aspects of the invention, even if the production conditions region extends into epitaxial defect region $\beta 1$, no OSF nuclei in the silicon wafer substrate readily grow into OSFs and appear in the epitaxial growth layer as epitaxial defects. As a result, the conditions for selecting the boron concentration and the growth condition V/G can be relaxed, enabling the yield to be improved even further.

An eighth aspect of the invention is characterized in a method for producing a silicon wafer, which comprises a step of controlling the boron concentration in the silicon crystal and the growth condition V/G (where V is the growth rate, and G is the temperature gradient in the crystal axis direction) so as to include at least an epitaxial defect region ($\beta 1$) where oxidation-induced stacking faults (OSF) occur in a silicon wafer substrate and defects occur in an epitaxial growth layer, and in controlling the silicon crystal heat treatment conditions and the oxygen concentration in the silicon crystal so that no OSF nuclei develop into OSFs.

According to the eighth aspect of the invention, even if the production conditions region is a range which includes the epitaxial defect region $\beta 1$, by controlling the silicon crystal heat treatment conditions and the oxygen concentration in the silicon crystals, no OSF nuclei in the silicon wafer substrate grow into OSFs and no epitaxial defects appear in the epitaxial growth layer. Hence, high-quality epitaxial silicon wafers can be produced in a high yield in a production conditions region having a high pull rate V.

A ninth aspect of the invention is characterized in a method for producing a silicon wafer, which comprises:

a silicon crystal production step of producing a silicon crystal while controlling the boron concentration in the silicon crystal and the growth condition V/G (where V is the growth rate, and G is the temperature gradient in the crystal axis direction) so as to fall in the vicinity of a lower limit line (LN3) within an epitaxial defect-free region ($\alpha 1$) where void defects occur in a silicon wafer substrate and an epitaxial growth layer is free of defects;

a silicon wafer substrate obtaining step of obtaining a silicon wafer substrate from the silicon crystal; and an epitaxial growth step of forming a thin-film epitaxial growth layer of no more than 2 μm on the silicon wafer substrate.

A tenth aspect of the invention is characterized in, in the silicon crystal production step of the silicon wafer production method according to the ninth aspect of the invention, controlling the oxygen concentration in the silicon crystal to no more than $12.5 \times 10^{17}$ atoms/cm³.

The ninth aspect of the invention was arrived at based on the discovery that void defects (COPs) are smaller in size and number near the lower limit line LN3 within epitaxial defect-free region a1 than in regions away from the lower limit line LN3. By controlling the boron concentration and growth condition V/G within the silicon crystal and thereby setting the production conditions region near the lower limit line LN3 within epitaxial defect-free region α1, the size and number of void defects (COPs) become smaller. Therefore, even when the epitaxial growth layer is formed as a thin film having a thickness of 2 μm or less, void defects within the silicon wafer substrate do not propagate to the epitaxial growth layer and clearly exist as epitaxial defects. As a result, high-quality, thin-film epitaxial silicon wafers can be produced in a good yield within a production conditions region having a high pull rate V.

By controlling the oxygen concentration within the silicon crystal to a low concentration of $12.5 \times 10^{17}$ atoms/cm$^3$ or less in accordance with the tenth aspect of the invention, even if the crystal production conditions region extends into the epitaxial defect region β1, no OSF nuclei in the silicon wafer substrate grow into OSFs and appear as epitaxial defects in the epitaxial growth layer. The conditions for setting the boron concentration and growth condition V/G can thus be relaxed, enabling the production yield to be increased even further.

BEST MODE FOR CARRYING OUT THE INVENTION

Embodiments of the silicon wafer production methods of the invention are described below in conjunction with the attached diagrams.

Figure 4:
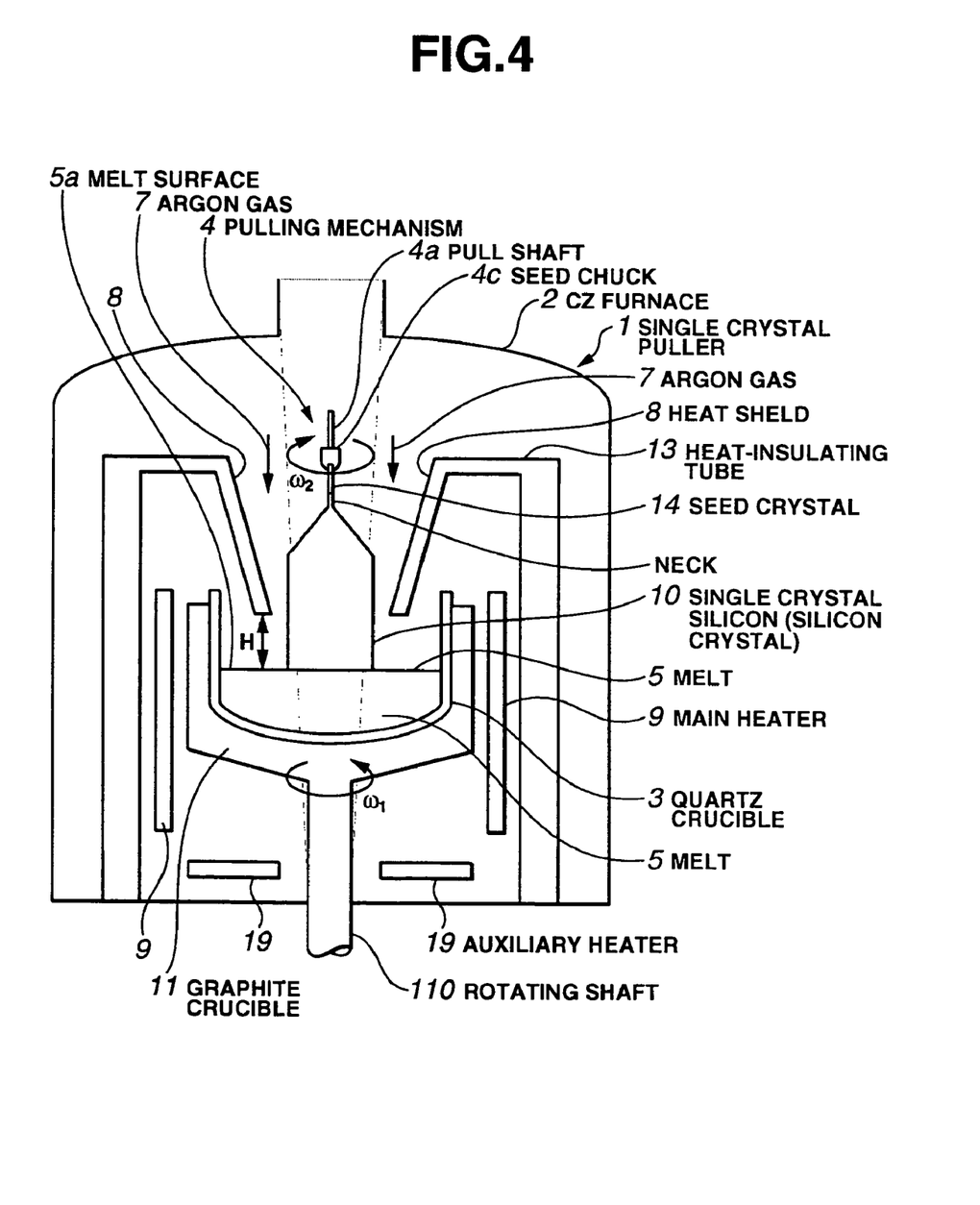
FIG. 4 shows the construction of a silicon crystal production apparatus (single crystal silicon growth system) such as may be used in the silicon wafer production method of the invention.

FIG. 4 is a side view showing the construction of a silicon crystal production apparatus such as may be used in the embodiments of the invention.

Referring to FIG. 4, a single crystal puller 1 according to this embodiment has a CZ furnace (chamber) 2 as the single crystal pulling enclosure.

Inside the CZ furnace 2, there is provided a quartz crucible 3 which melts the polysilicon starting material and holds it as a melt 5. The quartz crucible 3 is covered on the outside with a graphite crucible 11. A main heater 9 which heats and melts the polysilicon starting material inside the quartz crucible 3 is provided outside of and lateral to the quartz crucible 3. Below the quartz crucible 3, there is provided an auxiliary heater (bottom heater) 19 which additionally heats the base of the quartz crucible 3 to prevent solidification of the melt 5 at the base of the quartz crucible 3. The outputs (power; kW) of the main heater 9 and auxiliary heater 19 are independently controlled, thereby independently adjusting the heating rate of the melt 5. For example, the temperature of the melt 5 is detected and the detected temperature is used as a feedback value to control the respective outputs of the main heater 9 and the auxiliary heater 19 so that the melt 5 reaches a target temperature.

A heat-insulating tube 13 is provided between the main heater 9 and the inside wall of the CZ furnace 2.

A pulling mechanism 4 is provided above the quartz crucible 3. The pulling mechanism 4 includes a pull shaft 4a and a seed chuck 4c at the end of the pull shaft 4a. The seed chuck 4c holds a seed crystal 14.

Polysilicon (Si) is heated and melted within the quartz crucible 3. Once the temperature of the melt 5 stabilizes, the pulling mechanism 4 operates, pulling monocrystal silicon 10 (referred to hereinafter as "silicon crystal 10") from the melt 5. That is, the pull shaft 4a descends, immersing the seed crystal 14 held by the seed chuck 4c at the end of the pull shaft 4a into the melt 5. After the seed crystal 14 has been allowed to adjust to the melt 5, the pull shaft 4a is raised. As the seed crystal 14 held by the seed chuck 4c rises, the silicon crystal 10 grows. During pulling, the quartz crucible 3 is rotated at a spin rate ω1 by a rotating shaft 110. The pull shaft 4a of the pulling mechanism 4 is rotated at a spin rate ω2 in either the opposite direction or the same direction as the rotating shaft 110.

In this embodiment, boron (B) is added beforehand to the melt 5 in the quartz crucible 3 so as to incorporate boron in the silicon crystal 10 to be pulled.

The rotating shaft 110 can be driven in the vertical direction so as to move the quartz crucible 3 up or down to a desired position. By shutting the interior of the CZ furnace 2 off from outside air, a vacuum (e.g., about 20 Torr) within the furnace 2 is maintained. That is, argon gas 7 is supplied as an inert gas to the CZ furnace 2, then the CZ furnace 2 is evacuated through an exhaust port by a pump. The pressure within the furnace 2 is lowered in this way to a predetermined value.

In the course of the single crystal pulling process (1 batch), various evaporants arise within the CZ furnace 2. To remove these evaporants and thereby clean the CZ furnace 2, argon gas 7 is fed to the CZ furnace 2 then discharged outside of the CZ furnace 2 together with the evaporants. The feed rate of the argon gas 7 is set separately for each step in a single batch.

As the silicon crystal 10 is pulled, the amount of melt 5 decreases. As the amount of melt 5 decreases, the contact area between the melt 5 and the quartz crucible 3 changes, resulting in a change in the amount of oxygen dissolution from the quartz crucible 3. This change affects the distribution of the oxygen concentration within the pulled silicon crystal 10. To prevent this, additional polysilicon starting material or monocrystal silicon starting material is added, either during or after pulling, to the quartz crucible 3 in which the amount of melt 5 has decreased.

Above the quartz crucible 3, a heat shield 8 (gas flow regulating tube) shaped approximately as the inverted frustum of a cone is provided around the silicon crystal 10. The heat shield 8 is supported by the heat-insulating tube 13.

This heat shield 8 directs argon gas 7 as the carrier gas supplied into the CZ furnace 2 from above to the center of the melt surface 5*a,* causing the gas to pass over the melt surface 5*a* and reach the periphery thereof The argon gas 7 is then discharged, together with evaporated gases from the melt 5, through an exhaust port provided at the bottom of the CZ furnace 2. The gas flow rate at the surface of the liquid can thus be stabilized, enabling oxygen that evaporates from the melt 5 to be kept in a stable state.

The heat shield 8 also insulates and shields the seed crystal 14 and the silicon crystal 10 that grows from the seed crystal 14 from the radiant heat that emerges in high-temperature areas such as the quartz crucible 3, melt 5 and main heater 9. Furthermore, the heat shield 8 prevents impurities (e.g., silicon oxides) generated within the furnace from depositing on the silicon crystal 10 and impeding development of the single crystal. The size of the gap H between the bottom edge of the heat shield 8 and the melt surface 5*a* can be adjusted by raising and lowering the rotating shaft 110 and thereby changing the vertical position of the quartz crucible 3. The gap H can also be adjusted by moving the heat shield 8 upward or downward using a raising and lowering mechanism.

The growth condition V/G (where V is the growth rate, and G is the temperature gradient in the crystal axis direction) of the silicon crystal 10 is controlled by adjusting the gap H and the pull rate V by the pull shaft 4*a*.

The boron concentration (amount of boron added, atoms/$cm^3$) within the silicon crystal 10 is controlled by adjusting the amount of boron introduced to the quartz crucible 3.

The oxygen concentration (atoms/$cm^3$) within the silicon crystal 10 is controlled by regulating such parameters as the crucible spin rate ω1, the pulling shaft spin rate ω2, the argon gas flow rate and the pressure within the furnace.

The ingot of silicon crystal 10 produced by the apparatus in FIG. 4 is then sliced with a slicing machine to give a silicon wafer.

The silicon wafer is placed within the furnace of an epitaxial growth system, and a gas serving as the starting material for the thin layer, such as trichlorosilane ($SiHCl_3$) is supplied to the surface of the silicon wafer. Chemical reaction of the tridhlorosilane then causes a thin film of the same silicon to form by epitaxial growth on the surface of the silicon wafer substrate. A crystal having the same arrangement of atoms as the silicon wafer substrate is formed in this way as an epitaxial film on the substrate.

FIG. 1 shows the relationship, according to the present embodiment, between the boron concentration (atoms/$cm^3$) in the silicon crystal 10, the growth condition V/G, and the epitaxial defect regions and epitaxial defect-free regions.

The vertical axis in FIG. 1 represents the normalized pull rate V/Vcri when the temperature gradient G in the crystal vertical (axis) direction is assumed to be constant, and the horizontal axis represents the concentration of boron (atoms/$cm^3$) added to the silicon crystal 10. Here, the normalized pull rate VNcri is the pull rate normalized by the critical rate Vcri when the concentration of boron added is $1\times10^{17}$ atoms/$cm^3$, and the critical rate Vcri is the pull rate at the time that R-OSFs disappear at the center of the silicon crystal when the pull rate V is gradually decreased.

Epitaxial defect-free region α1 in FIG. 1 is an epitaxial defect-free region where void defects appear in the silicon wafer substrate and the epitaxial growth layer is free of defects. Epitaxial defect region β1 is an epitaxial defect region where OSFs appear in the silicon wafer substrate and defects appear in the epitaxial growth layer. Epitaxial defect-free region α2 is an epitaxial defect-free region where the silicon wafer substrate is free of defects and the epitaxial growth layer is free of defects. Epitaxial defect region β2 is an epitaxial defect region where dislocation loop clusters appear in the silicon wafer substrate and defects appear in the epitaxial growth layer.

FIG. 1 is explained by way of comparison with the prior art.

According to Prior-Art 3, it was predicted that epitaxial, defect-free region β2 has a lower limit at low boron concentrations (less than $1\times10^{18}$ atoms/$cm^3$), but does not have a lower limit at high boron concentrations ($1\times10^{18}$ atoms/$cm^3$ to $1\times10^{19}$ atoms/$cm^3$).

However, contrary to the above prediction, we have found that when the pull rate V is lowered, dislocation loop clusters which can cause epitaxial defects arise even in high boron concentration $p^+$ and $p^{++}$ silicon crystals.

That is, we discovered the line indicated by LN1 in FIG. 1 where, at boron concentrations in the silicon crystal of $1\times10^{18}$ atoms/$cm^3$ and above, the growth rate V gradually falls as the boron concentration increases to be the lower limit line of epitaxial defect-free region α2.

Production Method 1

Silicon crystal 10 is thus produced while controlling the boron concentration within the silicon crystal 10 and the growth condition V/G (where V is the growth rate, and G is the temperature gradient in the crystal axis direction) so as to lie within epitaxial defect-free region α2 and not fall below the lower limit line LN1.

Next, a silicon wafer substrate is obtained from the silicon crystal 10 thus produced.

Next, an epitaxial growth layer is formed on the silicon wafer substrate thus obtained.

As a result, there is produced a high-quality epitaxial silicon wafer in which defects appear in neither the silicon wafer substrate nor the epitaxial growth layer.

Defect characterization can be carried out, for example, by x-ray topography following copper (Cu) decoration. Various other techniques may also be used, such as infrared scattering, x-ray topography following oxygen precipitation heat treatment, etching optical microscopy following oxygen precipitation heat treatment, and Secco etch. Combinations of these techniques may also be used.

According to the present embodiment, the lower limit LN1 of epitaxial defect-free region α2 is clearly delineated, enabling boron concentrations and growth conditions V/G which do not fall below the lower limit LN1 to be precisely determined. By producing a silicon crystal 10 at a boron concentration and a growth condition V/G which do not fall below the lower limit LN1, high-quality epitaxial silicon wafers that are free of epitaxial defects can be produced in a good yield.

Embodiments such as the following in which controls have been added to foregoing Production Method 1 are also possible.

Production Method 2

In this Production Method 2, a control is added to make the temperature gradient G in the silicon crystal 10 axis direction when a silicon crystal 10 is produced by Production Method 1 uniform to within a given degree from the center of the crystal 10*c* to the crystal edge 10*e*.

Figure 2B:
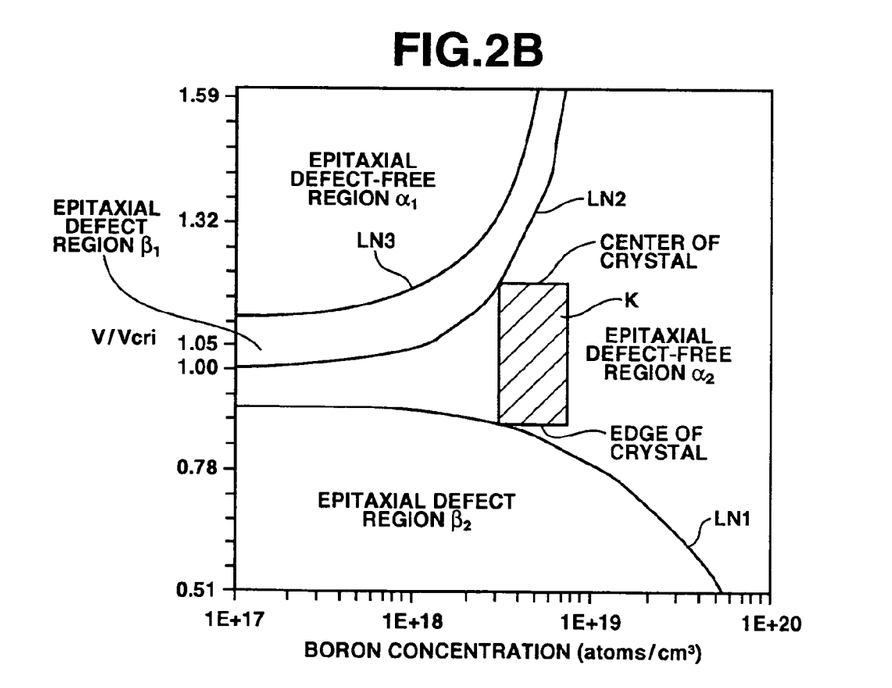

FIG. 2B shows an example of a production conditions region K when a silicon crystal 10 is produced by Production Method 1.

We have found that the vertical extent of production conditions region K in FIG. 2B is determined by the uniformity in the crystal radial direction of the temperature gradient G in the silicon crystal 10 axis direction, and the temperature gradient G in the crystal axis direction becomes uniform by giving the solid-liquid interface which is the boundary between the melt 5 and the silicon crystal 10 during pulling of the silicon crystal an upwardly convex shape.

Figure 3A:
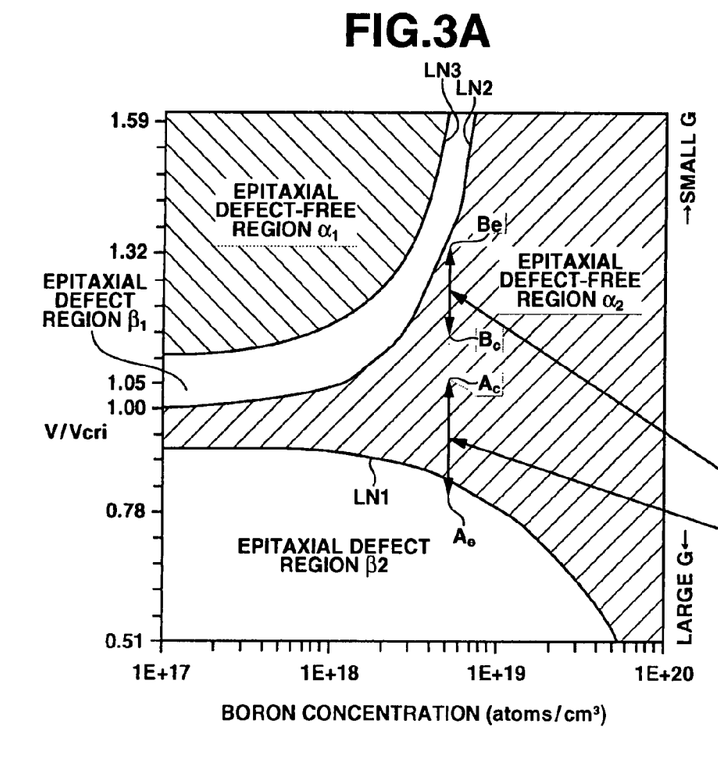
FIG. 3A is a diagram which corresponds to FIG. 1 and shows the relationship with the vertical extents Be to Bc and Ac to Ae of the production conditions regions.

FIG. 3A is a diagram which corresponds to FIG. 1. In FIG. 3A, the vertical extents of the production conditions regions are designated respectively as Be to Bc and Ac to Ae.

Figure 3B:
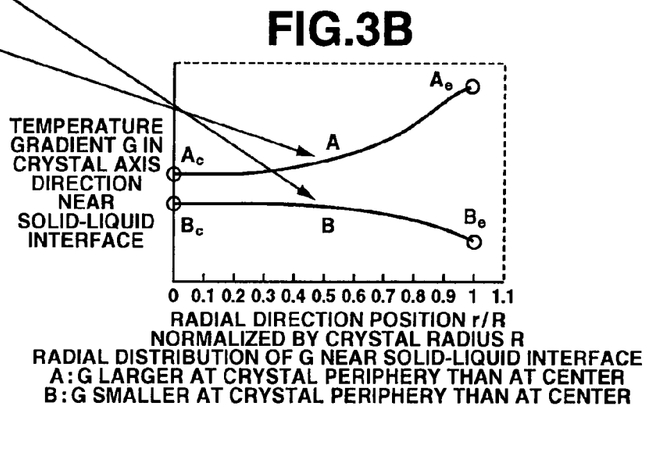
FIG. 3B is a diagram which shows the distribution in the crystal radial direction of the temperature gradient G in the crystal axis direction near the solid-liquid interface.
Figure 3C:
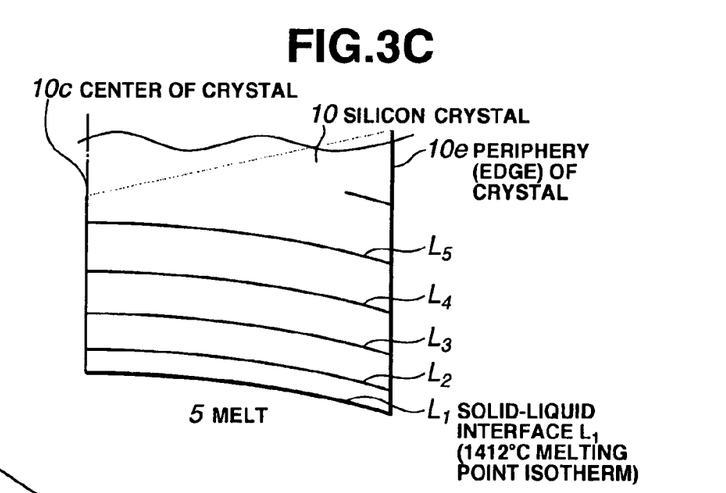
FIG. 3C is a diagram showing various isotherms in the crystal near the solid-liquid interface.

FIG. 3C shows the isotherms L1, L2, L3, L4 and L5 near the solid-liquid interface which is the boundary between the melt 5 and the silicon crystal 10 during pulling of the silicon crystal. In FIG. 3C, the isotherm L1 is an isotherm at the solid-liquid interface, and L2, L3, L4 and L5 are isotherms at positions of successively far from the solid-liquid interface in the crystal axis direction. Isotherms L1, L2, L3, L4 and L5 represent isotherms between the center 10c and the edge 10e (periphery) of the silicon crystal 10. The distance between the center 10c and edge 10e corresponds to the radius R of the silicon crystal 10. In FIG. 3C, the solid-liquid interface has an upwardly convex shape, along with which the temperature gradient G in the axial direction of the silicon crystal 10 can be seen to be uniform at each position r from the center 10c to the edge 10e of the crystal 10.

FIG. 3B shows the distribution in the crystal radius direction of the temperature gradient G in the direction of the crystal axis near the solid-liquid interface. The horizontal axis in FIG. 3B represents the radial position r/R in the radial direction of the silicon crystal 10 normalized by the radius R of the silicon crystal 10, and the vertical axis represents the temperature gradient G in the crystal axis direction near the solid-liquid interface.

Line A in FIG. 3B represents a case in which the temperature gradient Ae in the crystal axis direction at the edge 10e of the crystal is larger than the temperature gradient Ac in the crystal axis direction at the center 10c of the crystal. Line B in FIG. 3B represents a case in which the temperature gradient Be in the crystal axis direction at the edge 10e of the crystal is smaller than the temperature gradient Bc in the crystal axis direction at the center 10c of the crystal. Moreover, in this case, all of line A has a larger temperature gradient G in the crystal axis direction than line B.

As can be seen on comparing FIG. 3A with FIG. 3B, in FIG. 3A, the production conditions region Be to Bc throughout which the temperature gradient G in the crystal axis direction is smaller is situated above the production conditions region Ac to Ae throughout which the temperature gradient G in the crystal axis direction is larger. That is, as the temperature gradient G in the crystal axis direction becomes smaller, production conditions region Ac to Ae or Be to Bc approaches the upper limit LN2 of epitaxial defect-free region α2 (lower limit of epitaxial defect region β1), and as the temperature gradient G in the crystal axis direction becomes larger, the production conditions region Ac to Ae or Be to Bc approaches the lower limit LN1 of epitaxial defect-free region α2 (upper limit of epitaxial defect region β2).

Also, by having the temperature gradient Ae in the crystal axis direction at the edge 10e of the crystal be larger than the temperature gradient Ac in the crystal axis direction at the center 10c of the crystal, the crystal center 10c (Ac) having a small temperature gradient G in the crystal axis direction can be positioned above in FIG. 3A and the crystal edge 10e (Ae) having a larger temperature gradient G in the crystal axis direction can be positioned below in FIG. 3A. Similarly, by having the temperature gradient Be in the crystal axis direction at the edge 10e of the crystal be smaller than the temperature gradient Bc in the crystal axis direction at the center 10c of the crystal, the crystal edge 10e (Be) having a smaller temperature gradient G in the crystal axis direction can be positioned above in FIG. 3A and the crystal center 10c (Bc) having a larger temperature gradient G in the crystal axis direction can be position below in FIG. 3A.

The flatter line A in FIG. 3B becomes, i.e., the more uniform the temperature gradient G in the crystal axis direction at each position r/R from the center Ac to the edge Ae of the crystal, the smaller the vertical extent Ac to Ae of the production conditions region in FIG. 3A can be made. Likewise, the flatter line B in FIG. 3B becomes, i.e., the more uniform the temperature gradient G in the crystal axis direction at each position r/R from the center Bc to the edge Be of the crystal, the smaller the vertical extent Bc to Be of the production conditions region in FIG. 3A can be made.

Here, as shown in FIG. 3C, the temperature gradient G in the crystal axis direction becomes uniform by giving the solid-liquid interface an upwardly convex shape.

Therefore, in this embodiment, control is carried out so as to give the solid-liquid interface an upwardly convex shape, thereby making the temperature gradient G in the crystal axis direction uniform. As a result, the vertical extent Ac to Ae of the production conditions region or the vertical extent Be to Bc of the production conditions region in FIG. 3A becomes smaller. As the vertical extent Ac to Ae of the production conditions region in FIG. 3A becomes smaller, the edge 10e (Ae) of the crystal situated on the lower side in the diagram can be prevented from falling below the lower limit LN1 of epitaxial defect-free region α2 and entering epitaxial defect region β2. Similarly, as the vertical extent Be to Bc of the production conditions region in FIG. 3A becomes smaller, the edge 10e (Be) of the crystal situated on the upper side in the diagram can be prevented from exceeding the upper limit LN2 of epitaxial defect-free region α2 and entering epitaxial defect region β1.

Thus, in the present embodiment, the target production conditions region K in FIG. 2B can easily be made to fit within epitaxial defect-free region α2, enabling epitaxial defect-free, high-quality epitaxial silicon wafers to be produced in a higher yield.

Production Method 3

Next, an example of control to give the solid-liquid interface an upwardly convex shape is described.

In this Production Method 3, during the production of a silicon crystal 10, a magnetic field is applied to the silicon melt 5 from which the silicon crystal 10 is pulled, thereby giving the solid-liquid interface an upwardly convex shape and making the temperature gradient G in the axial direction of the silicon crystal 10 uniform to within a given degree between the crystal center 10c and the crystal edge 10e.

Exemplary methods for applying a magnetic field to the melt 5 include using a superconducting magnet to apply a horizontal magnetic field or to apply a cusp magnetic field.

Applying a magnetic field to the melt 5 suppresses convection within the melt 5. As a result, the heating rate by the main heater 9 for controlling the solid-liquid interface to the target temperature (e.g., 1412° C.) increases. In turn, the amount of heat which enters the solid-liquid interface from the melt 5 increases, giving the solid-liquid interface an upwardly convex shape.

Production Method 4

Next, another example of control to give the solid-liquid interface an upwardly convex shape is described.

In this Production Method 4, during the production of a silicon crystal 10, the silicon melt 5 from which the silicon crystal 10 is pulled is placed in a magnetic field-free state and the spin rate ω2 by the silicon crystal is controlled so as to make the temperature gradient G in the axis direction of the silicon crystal 10 uniform to within a given degree between the crystal center 10c and the crystal edge 10e.

Raising the spin rate ω2 of the silicon crystal 10 above a fixed level causes an upwardly swirling current to arise within the melt 5, activating heat transport at the center of the melt 5. This gives the solid-liquid interface an upwardly convex shape.

Figure 5A:
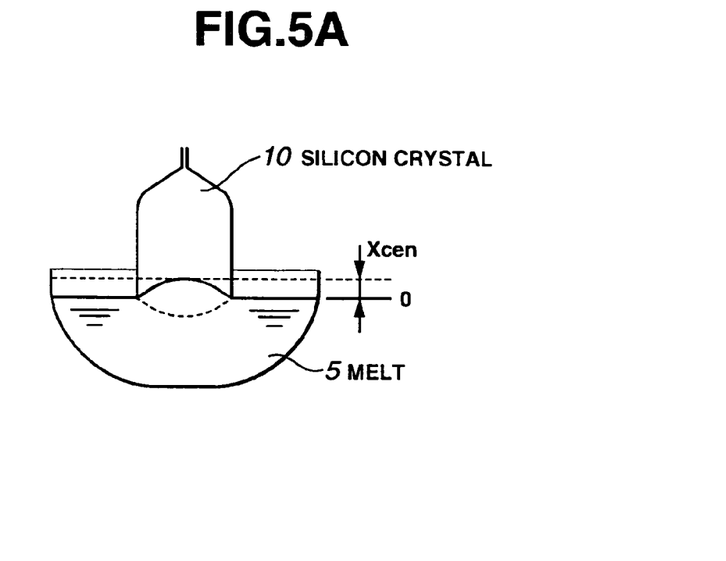
FIG. 5A illustrates the convexity of the solid-liquid interface.
Figure 5B:
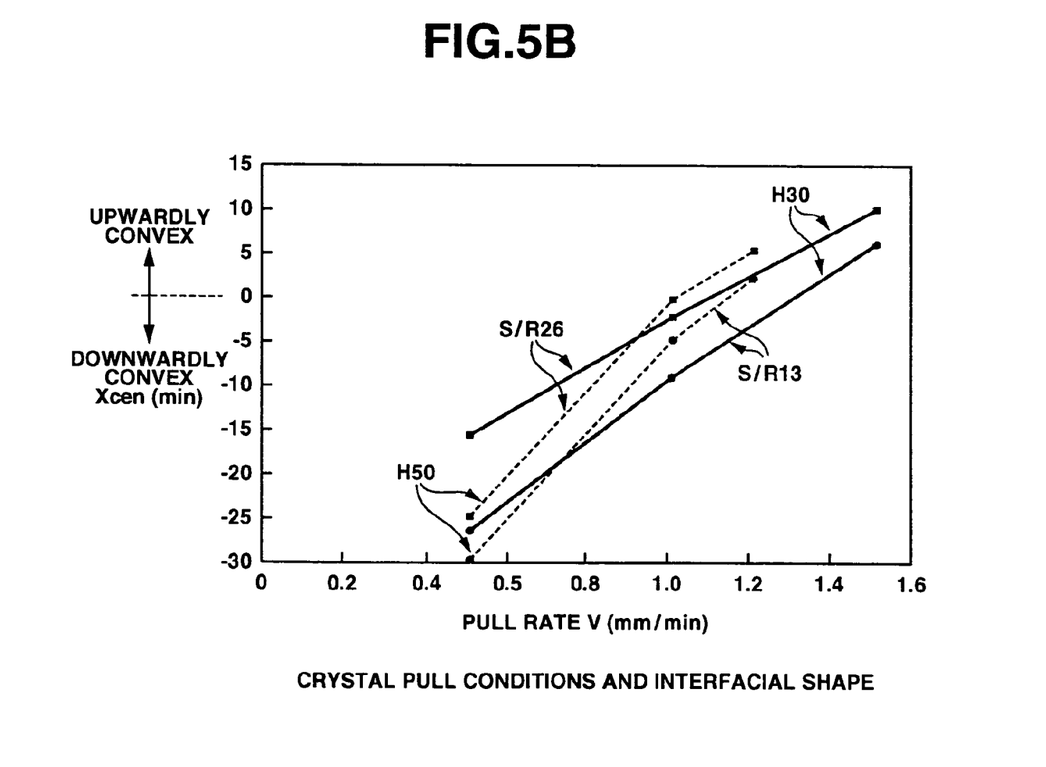
FIG. 5B is a diagram showing the experimental results obtained from an investigation of the change in convexity of the solid-liquid interface versus the crystal pulling conditions.

FIG. 5B shows the experimental results obtained from a study of the change in the convex shape of the solid-liquid interface versus the crystal pulling conditions when a 200 mm diameter silicon crystal 10 was pulled. The horizontal axis in FIG. 5B represents the pull rate V, and the vertical axis shows the center height (amount of protrusion) Xcen of the solid-liquid interface. When the center height (amount of protrusion) Xcen of the solid-liquid interface is a positive value, the solid-liquid interface is upwardly convex; when the center height (amount of protrusion) Xcen of the solid-liquid interface is a negative value, the solid-liquid interface is downwardly convex. The center height (amount of protrusion) Xcen of the solid-liquid interface is defined in FIG. 5A.

In FIG. 5B, S/R 26 represents a case in which the spin rate ω2 of the silicon crystal 10 was 26 rpm, S/R 30 represents a case in which the spin rate ω2 of the silicon crystal 10 was 30 rpm, H30 represents a case in which the gap H between the bottom edge of the heat shield 8 and the melt surface 5a was 30 mm, and H50 represents a case in which this gap H was 50 mm. A magnetic field was not applied.

Production Method 5

To give the solid-liquid interface an upwardly convex shape, it is also possible to control the spin rate ω1 of the quartz crucible 3 instead of controlling the spin rate ω2 of the silicon crystal 10.

In this Production Method 5, during the production of a silicon crystal 10, by placing the silicon melt 5 from which the silicon crystal 10 is pulled in a magnetic field-free state and controlling the spin rate ω1 of the quartz crucible 3, the temperature gradient G in the silicon crystal 10 axis direction is made uniform to within a given degree between the center 10c of the crystal and the edge 10e of the crystal.

Figure 6:
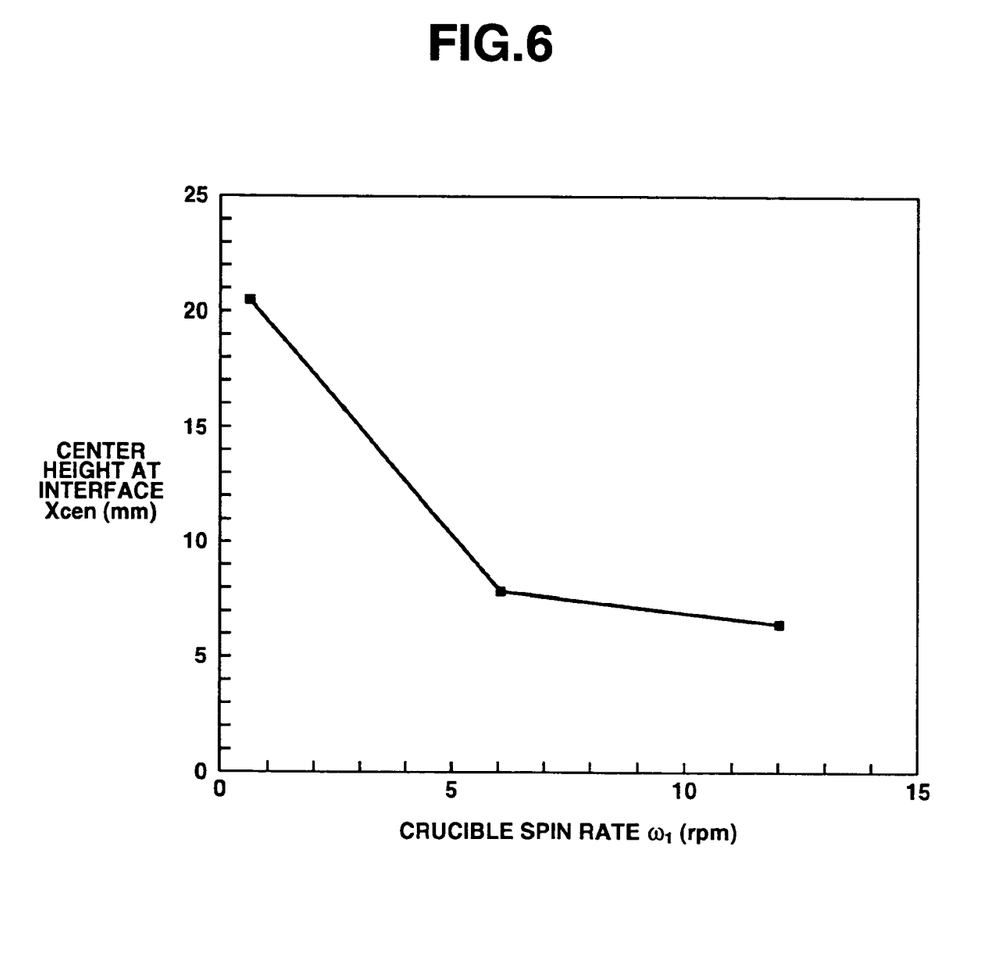
FIG. 6 is a diagram showing the experimental results obtained from an investigation of the change in convexity of the solid-liquid interface versus the number of rotations of the crucible.

FIG. 6 shows the experimental results obtained from a study of the change in the convex shape of the solid-liquid interface versus the spin rate ω1 of the quartz crucible 3. The horizontal axis in FIG. 6 represents the spin rate ω1 of the quartz crucible 3, and the vertical axis represents the center height (amount of protrusion) Xcen of the solid-liquid interface. The pull rate was 1.5 mm/min. A magnetic field was not applied.

Production Method 6

In this Production Example 6, during production of a silicon crystal 10 in Production Method 1, control of the oxygen concentration in the silicon crystal 10 to no more than $12.5 \times 10^{17}$ atoms/cm$^3$ is added.

In Production Method 1, it is assumed that the production conditions region K falls within epitaxial defect-free region α2, as shown in FIG. 2B. However, in some cases, the production conditions are relaxed and the silicon crystal 10 is produced in a production conditions region which extends into epitaxial defect region β1.

Here, control is carried out limiting the oxygen concentration in the silicon crystal 10 to no more than $12.5 \times 10^{17}$ atoms/cm$^3$. When the silicon crystal 10 has a low oxygen concentration, even if the crystal production conditions region extends into epitaxial defect region β1, OSF nuclei in the silicon wafer substrate do not readily grow into OSF defects and appear as epitaxial defects in the epitaxial growth layer. This allows the conditions for setting the boron concentration and the growth condition V/G to be relaxed, enabling the production yield to be further enhanced.

Production Method 7

In this Production Method 7, as shown in FIG. 2A, a silicon crystal 10 is produced by controlling the boron concentration within the silicon crystal 10 and the growth condition V/G such as to give a production conditions region J which at least includes epitaxial defect region β1. Here, "at least includes epitaxial defect region β1" refers to cases in which the production conditions region fits inside epitaxial defect region β1, cases in which it extends into both epitaxial defect region β1 and epitaxial defect-free region α1, cases in which it extends into both epitaxial defect region β1 and epitaxial defect-free region α2, and cases in which it extends into epitaxial defect region β1, epitaxial defect-free region α1 and epitaxial defect-free region α2.

Moreover, in Production method 7, the oxygen concentration in the silicon crystal 10 is controlled and the silicon wafer substrate is heat treated so as to keep OSF nuclei from developing into OSFs.

Oxygen concentration and heat treatment conditions to keep OSF nuclei from developing into OSFs are listed below.

1) Controlling the oxygen concentration in the silicon crystal 10 to no more than $12.5 \times 10^{17}$ atoms/cm$^3$, and administering heat treatment in a dry O$_2$ gas atmosphere at 1000° C. for 16 hours.

2) Controlling the oxygen concentration in the silicon crystal 10 to no more than 11 atoms/cm$^3$, and administering heat treatment in a wet O$_2$ gas atmosphere at 650° C. for 3 hours and at 1100° C. for 2 hours.

3) Controlling the oxygen concentration in the silicon crystal 10 to no more than 11 atoms/cm$^3$, and administering heat treatment in a dry O$_2$ gas atmosphere at 650° C. for 3 hours and at 1000° C. for 16 hours.

When the oxygen concentration in the silicon crystal 10 was controlled and the silicon wafer substrate was heat treated under oxygen concentration and heat treatment conditions such as those indicated above, the OSF nuclei in the silicon wafer substrate did not grow into OSFs and appear as defects in the epitaxial growth layer.

In this embodiment, epitaxial defects originating from OSFs do not arise even when the production conditions region is a range that includes epitaxial defect region β1. Hence, high-quality epitaxial silicon wafers can be produced in a good yield within a production conditions region J having a high pull rate V like that shown in FIG. 2A.

Production Method 8

We have discovered that, on approaching the lower limit line LN3 within epitaxial defect-free region α1, the size and number of void defects (COP) diminish. We learned that when thin-film epitaxial silicon wafers are produced, void defects propagate to the epitaxial growth layer and develop into epitaxial defects in the upper left-hand region of the diagram away from the lower limit line LN3 of the epitaxial defect-free region α1, but epitaxial defects originating from void defects do not develop in the region near the lower limit line LN3 inside epitaxial defect-free region α1.

Hence, this Production Method 8 produces a silicon crystal 10 by controlling the boron concentration in the silicon crystal 10 and the growth condition V/G so as to give a production conditions region near lower limit line LN3 yet within epitaxial defect-free region α1.

A silicon wafer substrate is then obtained from the silicon crystal 10 thus produced.

A thin-film epitaxial growth layer having a thickness of 2 μm or less is then formed on the silicon wafer substrate thus obtained.

Epitaxial defect-free, high-quality thin-film epitaxial silicon wafers are thus produced. According to this embodiment, high-quality thin-film epitaxial silicon wafers can be produced in a high yield at a high pull rate V.

Production Method 9

In this Production Method 9, during production of the silicon crystal 10 by Production Method 8, a control is added so as to limit the oxygen concentration in the silicon crystal 10 to no more than $12.5 \times 10^{17}$ atoms/cm³.

In this Production Method 9, during production of the silicon crystal 10 by Production Method 8, a control is added so as to limit the oxygen concentration in the silicon crystal 10 to no more than $12.5 \times 10^{17}$ atoms/cm³.

Hence, control is carried out which limits the oxygen concentration in the silicon crystal 10 to no more than $12.5 \times 10^{17}$ atoms/cm³. By giving the silicon crystal 10 a low oxygen concentration, even if the crystal production conditions region should extend into epitaxial defect region β1, no OSF nuclei in the silicon wafer substrate grow into OSF defects and appear in the epitaxial growth layer as epitaxial defects. The boron concentration and the growth condition V/G setting conditions can thus be relaxed, enabling further improvement in the production yield.

The invention claimed is:

1. A method for producing a silicon wafer, comprising:
a silicon crystal production step of producing a silicon crystal while controlling a concentration of boron in the silicon crystal and a growth condition V/G (where V is a growth rate, and G is a temperature gradient in a crystal axis direction) by using, as boundary condition, a prescribed relationship between the boron concentration in the silicon crystal and the growth condition V/G (where V is the growth rate, and G is the temperature gradient in the crystal axis direction), which is shown by a lower limit line (LN1) of an epitaxial defect-free region (α2), so as to fall within the epitaxial defect-free region (α2) which is a defect-free region in which a silicon wafer substrate is free of defects and an epitaxial growth layer is free of defects and which has the lower limit line (LN1) in which, at the boron concentrations in the silicon crystal of $1 \times 10^{18}$ atoms/cm³ and above, the growth rate V gradually decreases as the boron concentration rises, and so as not to fall within an epitaxial defect region (β2) in which a dislocation loop cluster occurs in the silicon wafer substrate and defects occur in the epitaxial growth layer and in which the lower limit line (LN1) is an upper limit line;
a silicon wafer substrate obtaining step of obtaining the silicon wafer substrate from the silicon crystal; and
an epitaxial growth step of forming the epitaxial growth layer on the silicon wafer substrate, wherein in the silicon crystal production step, controlling the oxygen concentration in the silicon crystal to no more than $12.5 \times 10^{17}$ atoms/cm³.

2. The silicon wafer production method according to claim 1, characterized in, in the silicon crystal production step, controlling to make the temperature gradient G in the silicon crystal axis direction uniform between a center of the crystal and an edge of the crystal to such an extent that a region between the center of the crystal and the edge of the crystal does fall under the lower limit line (LN1) of the epitaxial defect-free region (α2).

3. The silicon wafer production method according to claim 2, characterized in, in the silicon crystal production step, applying a magnetic field to a silicon melt from which the silicon crystal is pulled, thereby controlling to make the temperature gradient G in the silicon crystal axis direction uniform between the center of the crystal and the edge of the crystal.

4. The silicon wafer production method according to claim 2, characterized in, in the silicon crystal production step, bringing the silicon melt from which the silicon crystal is pulled to a magnetic field-free state and controlling the number of rotations of the silicon crystal, thereby controlling to make the temperature gradient G in the silicon crystal axis direction uniform between the center of the crystal and the edge of the crystal.

5. The silicon wafer production method according to claim 2, characterized in, in the silicon crystal production step, bringing the silicon melt from which the silicon crystal is pulled to a magnetic field-free state and controlling the number of rotations of a quartz crucible holding the silicon melt, thereby controlling to make the temperature gradient G in the silicon crystal axis direction uniform between the center of the crystal and the edge of the crystal.

6. A method for producing a silicon wafer, comprising:
controlling a boron concentration in a silicon crystal and a growth condition V/G (where V is a growth rate, and G is a temperature gradient in a crystal axis direction) so as to include at least an epitaxial defect region (β1) in which oxidation-induced stacking faults (OSF) occur in a silicon wafer substrate and defects occur in an epitaxial growth layer;
performing heat treatment on the silicon crystal; and
controlling the oxygen concentration in the silicon crystal no more than $12.5 \times 10^{17}$ atoms/cm³ so that no OSF nuclei develop into OSFs.

7. A method for producing a silicon wafer, comprising:
a silicon crystal production step of producing a silicon crystal while controlling a boron concentration in the silicon crystal and a growth condition V/G (where V is a growth rate, and G is a temperature gradient in a crystal axis direction) so as to fall in an epitaxial defect-free region (α1) in which void defects occur in a silicon wafer substrate and epitaxial defects that are a cause of the void defects, do not appear on an epitaxial growth layer after forming a thin film epitaxial growth layer of less than 2 μm on the silicon wafer substrate where the void defects occur;
a silicon wafer substrate obtaining step of obtaining the silicon wafer substrate from the silicon crystal; and
an epitaxial growth step of forming the thin-film epitaxial growth layer of no more than 2 μm on the silicon wafer substrate, wherein in the silicon crystal production step, controlling the oxygen concentration in the silicon crystal to no more than $12.5 \times 10^{17}$ atoms/cm³.

* * * * *